(12) United States Patent
Choi et al.

(10) Patent No.: US 8,354,719 B2
(45) Date of Patent: Jan. 15, 2013

(54) FINNED SEMICONDUCTOR DEVICE WITH OXYGEN DIFFUSION BARRIER REGIONS, AND RELATED FABRICATION METHODS

(75) Inventors: Kisik Choi, Hopewell Junction, NY (US); Robert J. Miller, Yorktown Heights, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 367 days.

(21) Appl. No.: 12/708,213

(22) Filed: Feb. 18, 2010

(65) Prior Publication Data

US 2011/0198696 A1    Aug. 18, 2011

(51) Int. Cl.
*H01L 27/12* (2006.01)

(52) U.S. Cl. ......... 257/347; 257/E27.112; 257/E21.561; 257/E21.294; 438/157; 438/423; 438/585

(58) Field of Classification Search .................... 257/347
See application file for complete search history.

(56) References Cited

U.S. PATENT DOCUMENTS

| | | | | |
|---|---|---|---|---|
| 6,037,224 A * | 3/2000 | Buller et al. | ................ | 438/258 |
| 6,774,022 B2 * | 8/2004 | Wang et al. | ................ | 438/585 |
| 7,612,405 B2 * | 11/2009 | Yu et al. | ................ | 257/328 |
| 7,723,188 B2 * | 5/2010 | Kim et al. | ................ | 438/267 |
| 2003/0060039 A1 * | 3/2003 | Wang et al. | ................ | 438/649 |
| 2003/0235965 A1 * | 12/2003 | Takehiro | ................ | 438/305 |
| 2004/0058499 A1 * | 3/2004 | Ishitsuka et al. | ................ | 438/296 |
| 2004/0082196 A1 * | 4/2004 | Wakamiya | ................ | 438/783 |
| 2005/0062099 A1 * | 3/2005 | Yoshiyama et al. | ................ | 257/324 |
| 2005/0179069 A1 * | 8/2005 | Wakamiya | ................ | 257/288 |
| 2005/0280051 A1 * | 12/2005 | Chidambarrao et al. | ...... | 257/274 |
| 2006/0065927 A1 * | 3/2006 | Thean et al. | ................ | 257/331 |
| 2006/0068553 A1 * | 3/2006 | Thean et al. | ................ | 438/285 |
| 2006/0214254 A1 * | 9/2006 | Ishitsuka et al. | ................ | 257/499 |
| 2006/0234456 A1 * | 10/2006 | Anderson et al. | ................ | 438/284 |
| 2007/0018231 A1 * | 1/2007 | Mitani et al. | ................ | 257/315 |
| 2007/0057325 A1 * | 3/2007 | Hsu et al. | ................ | 257/347 |
| 2007/0158756 A1 * | 7/2007 | Dreeskornfeld et al. | ...... | 257/374 |
| 2009/0173998 A1 * | 7/2009 | Mise et al. | ................ | 257/347 |
| 2010/0044803 A1 * | 2/2010 | Chen et al. | ................ | 257/408 |
| 2010/0176460 A1 * | 7/2010 | Goto | ................ | 257/392 |
| 2011/0147811 A1 * | 6/2011 | Kavalieros et al. | ........... | 257/288 |

* cited by examiner

*Primary Examiner* — N Drew Richards
*Assistant Examiner* — Ankush Singal
(74) *Attorney, Agent, or Firm* — Ingrassia Fisher & Lorenz, P.C.

(57) ABSTRACT

A semiconductor device and related fabrication methods are provided. One exemplary fabrication method forms a fin arrangement overlying an oxide layer, where the fin arrangement includes one or more semiconductor fin structures. The method continues by nitriding exposed portions of the oxide layer without nitriding the one or more semiconductor fin structures, resulting in nitrided portions of the oxide layer. Thereafter, a gate structure is formed transversely overlying the fin arrangement, and overlying the exposed portions of the oxide layer. The nitrided portions of the oxide layer substantially inhibit diffusion of oxygen from the oxide layer into the gate structure.

26 Claims, 6 Drawing Sheets

FINNED SEMICONDUCTOR DEVICE WITH OXYGEN DIFFUSION BARRIER REGIONS, AND RELATED FABRICATION METHODS

TECHNICAL FIELD

Embodiments of the subject matter described herein relate generally to semiconductor devices and related manufacturing processes. More particularly, embodiments of the subject matter relate to methods of forming finned semiconductor devices, such as FinFET devices.

BACKGROUND

Transistors, such as metal oxide semiconductor field-effect transistors (MOSFETs), are the core building block of the vast majority of semiconductor devices. Some semiconductor integrated circuits, such as high performance processors or processing units, can include billions of transistors. For such devices, decreasing transistor size, and thus increasing transistor density, has traditionally been a high priority in the semiconductor manufacturing industry.

A FinFET is a type of transistor that can be fabricated using very small scale processes. FIG. 1 is a simplified perspective view of a FinFET 10, which is formed on a semiconductor wafer substrate 12. A FinFET is named for its use of one or more fins 14, which are formed from the semiconductor material of the substrate 12. As shown in FIG. 1, each fin 14 extends between a source region 16 and a drain region 18 of the FinFET 10. The FinFET 10 also includes a gate structure 20 that is formed over and across the fins 14. The surface area of the fins 14 in contact with the gate structure 20 determines the effective channel of the FinFET 10. Semiconductor materials suitable for creating FinFETs include, but are not limited to silicon, germanium, silicon-germanium alloys, and III-V materials such as GaAs, InGaAs, and InP.

BRIEF SUMMARY

A method of fabricating a semiconductor device is provided. The method forms a fin arrangement overlying a substrate that contains regions of oxide material, the fin arrangement comprising one or more semiconductor fin structures. The method continues by creating an oxygen diffusion barrier in the substrate, and by forming a gate structure transversely overlying the fin arrangement, and overlying the oxygen diffusion barrier, wherein the oxygen diffusion barrier substantially inhibits diffusion of oxygen from the oxide layer into the gate structure.

Another method of fabricating a semiconductor device is also provided. This method involves providing a semiconductor-on-insulator substrate having an oxide insulator layer and a layer of semiconductor material overlying the oxide insulator layer. This method continues by forming fin structures from the layer of semiconductor material, each of the fin structures extending above an exposed upper surface of the oxide insulator layer, treating exposed portions of the oxide insulator layer to create oxygen diffusion barrier regions near the exposed upper surface of the oxide insulator layer, and forming a gate structure transversely overlying the fin structures, and overlying the oxygen diffusion barrier regions. The oxygen diffusion barrier regions substantially inhibit diffusion of oxygen from the oxide insulator layer into the gate structure.

Also provided is a semiconductor device structure having a layer of oxide insulation material having an upper surface, a plurality of semiconductor fin structures formed overlying the layer of oxide insulation material, a gate structure transversely formed overlying the semiconductor fin structures such that base sections of the gate structure overlie the upper surface between adjacent semiconductor fin structures, and oxygen diffusion barrier regions of the oxide insulation material. The oxygen diffusion barrier regions are located near the upper surface and adjacent the base sections of the gate structures, and they substantially inhibit diffusion of oxygen from the layer of oxide insulation material into the base sections of the gate structure.

Another semiconductor device structure is also provided. This device structure includes: a substrate of semiconductor material; a plurality of semiconductor fin structures formed from the semiconductor material; oxide isolation regions between the semiconductor fin structures; a gate structure transversely formed overlying the semiconductor fin structures; and oxygen diffusion barrier regions of the oxide isolation regions. The oxygen diffusion barrier regions substantially inhibit diffusion of oxygen from the oxide isolation regions into the gate structure.

Yet another method of fabricating a semiconductor device is also provided. This method begins by providing a semiconductor-on-insulator substrate having an oxide insulator layer, a layer of semiconductor material overlying the oxide insulator layer, and an oxygen diffusion barrier between the oxide insulation layer and the layer of semiconductor material. The method proceeds by forming fin structures from the layer of semiconductor material, and by forming a gate structure transversely overlying the fin structures, and overlying the oxygen diffusion barrier. The oxygen diffusion barrier substantially inhibits diffusion of oxygen from the oxide insulator layer into the gate structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
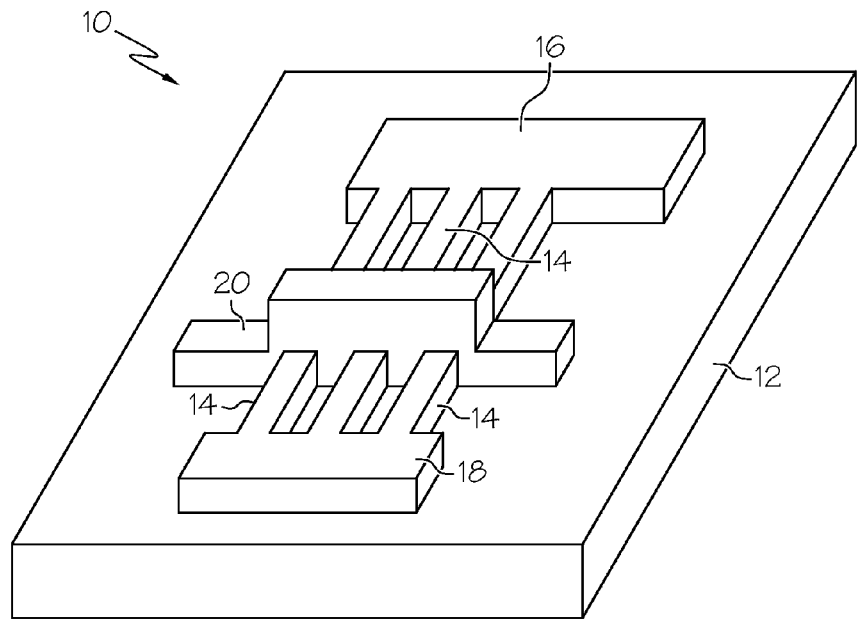
FIG. 1 is a simplified perspective view of a conventional FinFET having a plurality of fins.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" may be used to describe the orientation and/or location of a feature or element within a consistent but arbitrary frame of reference which is made clear by reference to the text and the associated drawings describing the component under discussion. Such terminology may include the words specifically mentioned above, derivatives thereof, and words of similar import.

Techniques and technologies described herein may be utilized to fabricate MOS transistor devices, including NMOS transistor devices, PMOS transistor devices, and NMOS/PMOS device combinations referred to as CMOS devices. Although the term "MOS device" properly refers to a device having a metal gate electrode and an oxide gate insulator, that term will be used throughout to refer to any semiconductor device that includes a conductive gate electrode (whether metal or other conductive material) that is positioned over or around a gate insulator (whether oxide or other insulator) which, in turn, is positioned over a semiconductor region or regions, or around the same as in the case of FinFET devices. Various steps in the manufacture of MOS components and FinFETs are well known and so, in the interest of brevity, many conventional steps will only be mentioned briefly herein or will be omitted entirely without providing the well known process details. As used here, the term "FinFET" refers both to finned devices where only the vertical walls of the fins are influenced by gate voltages (double-gate devices) and to finned devices where the fin top surface as well as the fin vertical walls are influenced by gate voltages (also known as "trigate" or "triple gate" devices).

The threshold voltage of semiconductor transistor devices is influenced by certain geometrical and physical properties of the gate dielectric and gate conductor materials, including semiconductor transistor devices that employ gate structures formed using a high dielectric constant gate insulator material combined with a metal gate material (commonly referred to as a high-k metal gate, or HKMG, structure). Some high-k insulator materials have various favorable physical properties, but may also have the property that they contain oxygen as well as a concentration of oxygen lattice vacancies, and are able to transport, acquire, or relinquish oxygen, thereby altering the oxygen vacancy concentration. These physical changes can influence the threshold voltage of a semiconductor transistor device, and thus it is desirable to substantially limit the oxygen acquisition or transport property of the high-k insulator material by limiting its access to oxygen from proximal sources.

A proximal source can be any oxygen-containing or oxygen-transporting material in intimate contact with or within close proximity to the high-k dielectric material, such as an underlying oxide, sometimes referred to as buried oxide, or a boundary-isolating oxide known as shallow trench isolation (STI). In practice, during fabrication steps or other potential exposures to oxygen, the underlying or boundary oxide itself can acquire and transport oxygen toward the high-k dielectric. Then the oxygen migrates from the underlying or boundary oxide material and diffuses into the high-k gate insulator. This phenomenon occurs in both planar semiconductor transistor devices and FinFET devices.

Figure 2:
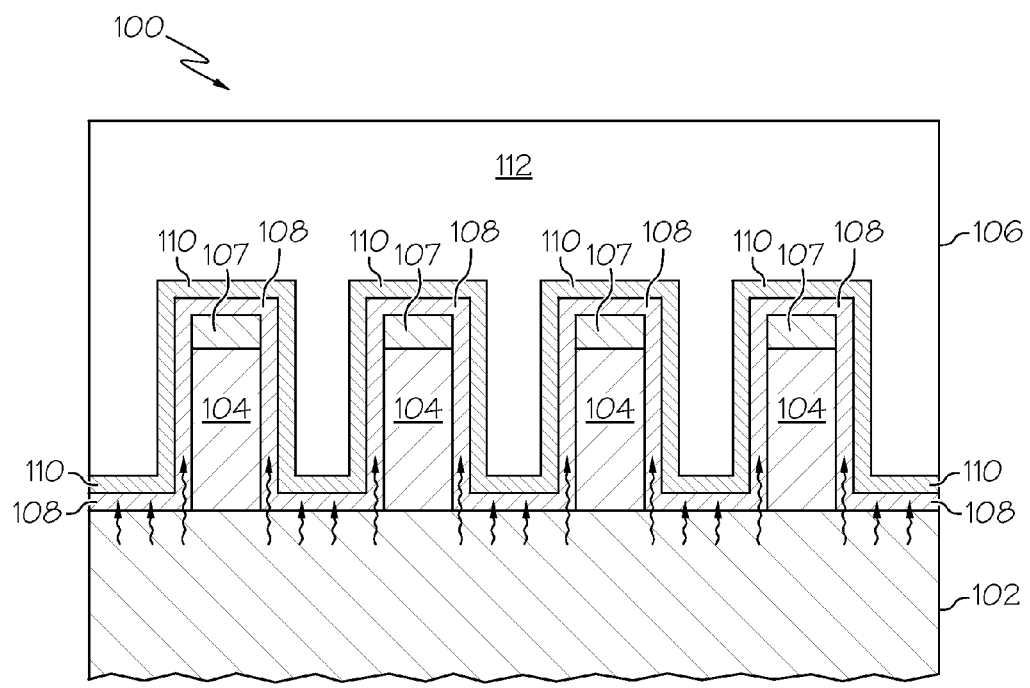
FIG. 2 is a cross-sectional view of a FinFET that illustrates oxygen diffusion from an oxide layer into a gate insulator layer.

FIG. 2 is a cross-sectional view of a FinFET device structure 100 that illustrates the oxygen diffusion phenomena described above. The FinFET device structure 100 includes an oxide layer 102, nominally four semiconductor fin structures 104 formed overlying the oxide layer 102, and a gate structure 106 formed overlying the semiconductor fin structures 104. FIG. 2 also depicts nitride caps 107 on the semiconductor fin structures 104. FIG. 2 represents a cross section of the FinFET device structure 100 taken at a vertical plane through the gate structure 106 and transverse across the four semiconductor fin structures 104. The gate structure 106 employs a HKMG composition that includes a high-k gate insulator 108, a metal gate layer 110 overlying the high-k gate insulator 108, and optionally a layer of amorphous or polycrystalline silicon 112 overlying the metal gate layer 110.

The arrows in FIG. 2 represent the diffusion of oxygen from the oxide layer 102 into the high-k gate insulator 108. This diffusion occurs at or near the upper surface of the oxide layer 102, where the high-k gate insulator 108 contacts the oxide layer 102. As mentioned above, this form of oxygen diffusion induces a change in the threshold voltage of the FinFET device structure 100. As distinguished from wide planar semiconductor devices, FinFET devices are particularly susceptible to such oxygen diffusion because (1) a wide FinFET device is composed of many fins, and (2) the average distance from anywhere on the fin vertical surfaces to the oxide layer 102 is extremely small.

The FinFET device structure described here employs an oxygen diffusion barrier region in the boundary-insulating oxide (e.g., STI or local oxidation of silicon (LOCOS)) for FinFET devices formed on a bulk semiconductor substrate, or in the buried and adjacent exposed oxide for FinFET devices formed on an SOI substrate. In certain embodiments, the oxide material is subjected to a nitridation treatment or process that introduces nitrogen into the oxide material. The resulting nitrided material serves as an effective oxygen diffusion barrier that prevents or substantially inhibits the diffusion of oxygen into the gate insulator material.

Figure 3:
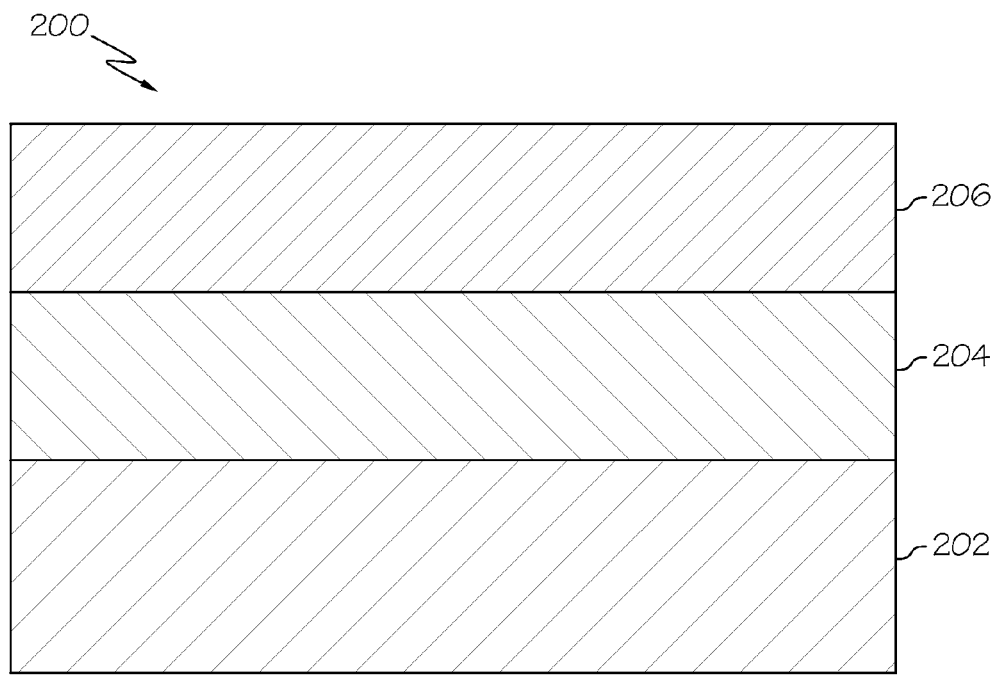
FIGS. 3-6 are cross-sectional views that illustrate a semiconductor device structure and an exemplary process for fabricating it.

FIGS. 3-6 are cross-sectional views that illustrate a semiconductor device structure and an exemplary process for fabricating it. This fabrication process represents one implementation of a method that is suitable for use with finned semiconductor devices, such as FinFETs. An embodiment of this fabrication process may begin by providing an appropriate substrate that is formed from or otherwise comprises a semiconductor material. FIG. 3 depicts an exemplary embodiment of an SOI substrate 200, which includes a support layer 202, a layer of insulation material 204 overlying or residing on the support layer 202, and a layer of semiconductor material 206 overlying or residing on the layer of insulation material 204. The semiconductor material 206 is preferably a silicon material as typically used in the semiconductor industry, e.g., relatively pure silicon as well as silicon admixed with other elements such as germanium, carbon, and the like. Alternatively, the semiconductor material 206 can be germanium, gallium arsenide, or the like. The semiconductor material 206 need not be doped, although it may be very lightly doped as either n-type or p-type, without impacting the manufacturing process described here. For example, a lightly doped p-type semiconductor material 206 could be used for the embodiment described here. Of course, the semiconductor material 206 can be subsequently doped in an appropriate manner to form active regions in a manner that is well understood by those familiar with semiconductor manufacturing techniques.

For the described embodiments, the insulation material 204 includes or is realized as an oxide material, such as silicon dioxide or the like; however it might also be any insulation material having the property that oxygen migration can occur within its lattice or glassy structure. Accordingly, the insulation material 204 may be alternatively referred to herein using any of the following terms, without limitation: oxide layer; oxide material; buried oxide layer; oxide insulator layer; oxide insulation material; or the like. In some instances, the insulation material could include multiple layers, such as a liner layer accompanied by an oxide fill layer. In such cases, the liner layer might be a material having different properties. In an exemplary embodiment, the thickness of the layer of insulation material 204 is about 300 nanometers, however, in practical embodiments, the thickness of the layer of insulation material 204 may range from about five nanometers to about 1000 nanometers. In an exemplary embodiment, the thickness of the semiconductor material 206 is about 65 nanometers, however, in practical embodiments, the thickness of the semiconductor material 206 may range from about ten nanometers to about 100 nanometers, and the width of individual fins might range from about seven nanometers to about 60 nanometers.

Figure 4:
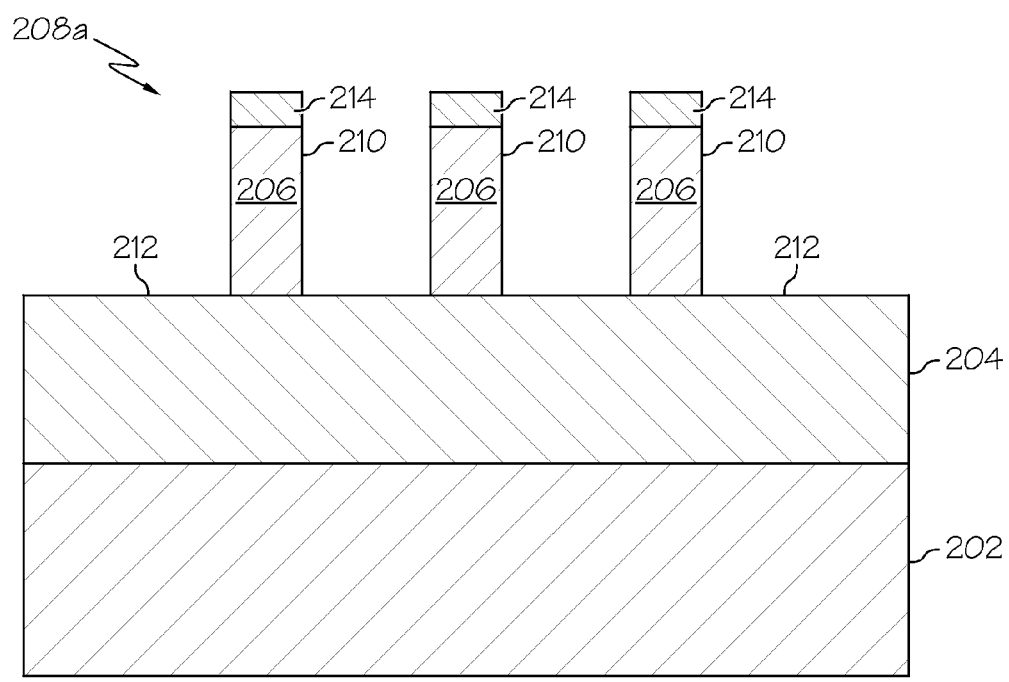

The fabrication process may continue by forming one or more semiconductor fin structures from the layer of semiconductor material 206. FIG. 4 depicts the state of the semiconductor device structure 208a after fabrication of a plurality of semiconductor fin structures 210. Although any number of fin structures could be created, FIG. 4 depicts an exemplary fin arrangement that includes three semiconductor fin structures 210. As shown in FIG. 4, each of the semiconductor fin structures 210 extends above an exposed upper surface 212 of the layer of insulation material 204. Accordingly, the fin arrangement is formed overlying the layer of insulation material 204 such that some of the insulation material 204 remains exposed.

The semiconductor fin structures 210 can be created using any number of known process steps and techniques. One such method employs well-known processes of lithography and anisotropic etch. If fins are desired to be of such thickness that they are too thin for creation by lithography directly, then known methods creating spacers can be applied in such a manner that spacers composed of nitride or other etch-resistant material become the pattern and hardmask for fin creation. In accordance with certain embodiments, the nitride spacer material remains on the underlying semiconductor material 206. In this regard, FIG. 4 depicts the remaining hard mask material 214 (also referred to as nitride caps) at the upper ends of the semiconductor fin structures 210. In some embodiments, however, the hard mask material 214 is removed after etching the semiconductor material 206 to form the semiconductor fin structures 210, or its use is avoided entirely.

Figure 5:
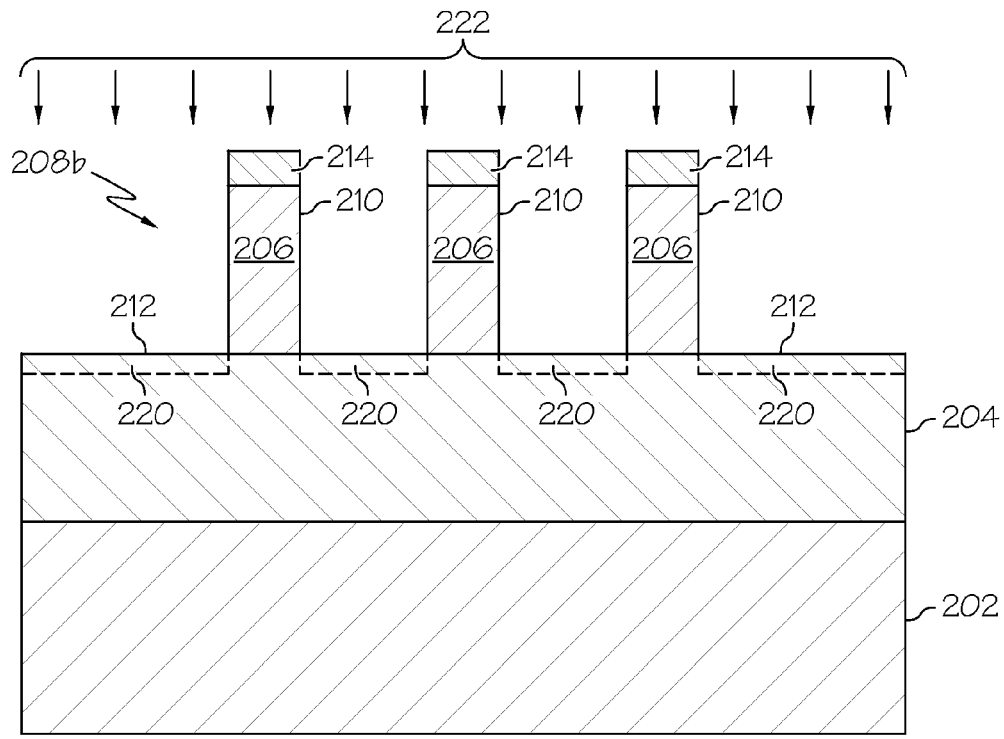

Referring now to FIG. 5, the illustrated embodiment of the fabrication process continues by treating the exposed portions of the layer of insulation material 204 to create oxygen diffusion barrier regions 220 at and within the exposed upper surface 212 of the layer of insulation material 204. This particular embodiment forms the oxygen diffusion barrier regions 220 by nitriding the exposed portions of the layer of insulation material 204 using a suitable technique that does not result in nitriding the semiconductor fin structures 210. The nitriding procedure may be accomplished by ion implantation, as depicted in FIG. 5. In this regard, FIG. 5 depicts the semiconductor device structure 208b undergoing an ion implantation treatment during which ions of a nitrogen-containing species (depicted by the arrows 222) are implanted into certain areas of the layer of insulation material 204. More specifically, the hard mask material 214 is used as an ion implantation mask protecting the fin semiconductor material from the implantation species during this ion implantation procedure. The nitrogen ion implantation of the exposed portions of the layer of insulation material 204 results in nitridation of the oxide material and formation of the oxygen diffusion barrier regions 220. In other words, the oxygen diffusion barrier regions 220 are realized as nitrided regions of the insulation material 204, and the oxygen diffusion barrier regions 220 correspond to implant regions having ions of a nitrogen-containing species implanted therein.

In practice, the nitrogen source for the ion implantation procedure may be, for example, $N_2$, N, $NH_3$, or any nitrogen species. The implantation energy could range from a few keV to about 50 keV, and the dose could be within the range from about $1 \times 10^{14}$ cm$^{-2}$ to about $1 \times 10^{16}$ cm$^{-2}$. Moreover, the orientation of the ion bombardment is preferably as shown in FIG. 5, namely, parallel to the sidewalls of the semiconductor fin structures 210 (this minimizes or prevents unwanted ion implantation into the semiconductor material 206). It should be appreciated that these parameters and other aspects of the ion implantation procedure can be controlled in an appropriate manner to create oxygen diffusion barrier regions 220 having the desired depth and profile.

In some embodiments, spacers are present adjacent the sidewalls of the semiconductor fin structures 210 before the ion implantation procedure. These optional sidewall spacers are not shown in FIGS. 4-6. These sidewall spacers may be sacrificial and specifically intended to protect the semiconductor fin structures 210 during the ion implantation procedure, or they may be formed for other purposes. When these spacers are used, some consideration is given to optimizing the implantation energy and dose parameters in such a manner that removal of the sacrificial spacers does not result in complete removal of the nitrogen-containing diffusion barrier.

Figure 6:
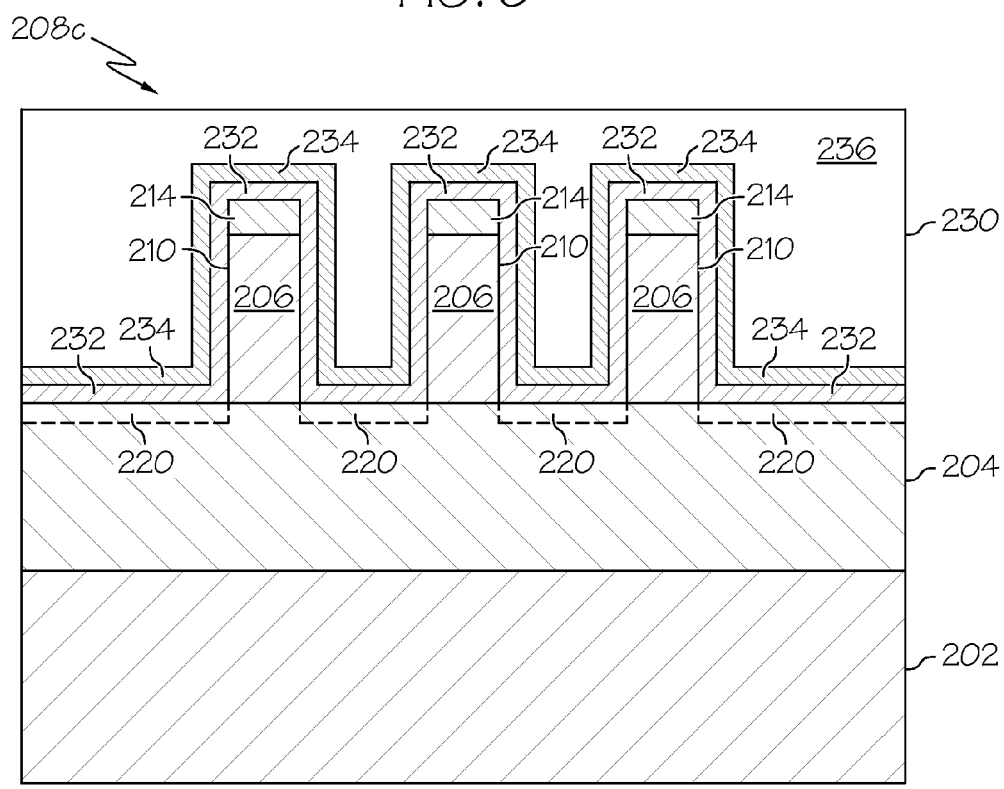

Although other fabrication steps and sub-processes may be performed at this time, the exemplary embodiment continues by forming a gate structure overlying the fin arrangement. FIG. 6 depicts the state of the semiconductor device structure 208c after the fabrication of a gate structure 230, which transversely overlies the semiconductor fin structures 210, and which overlies some of the exposed portions of the layer of insulation material 204. The gate structure 230 employs a composition that includes a layer of insulating material 232, a layer of metal material 234 overlying the layer of insulating material 232, and optionally a layer of amorphous silicon, polycrystalline silicon, or other conductive material 236 overlying the layer of metal material 234. In certain embodiments, the gate structure 230 is an HKMG structure that utilizes a high-k dielectric material for the insulating material 232. Depending upon the embodiment, the high-k material may be, without limitation: $HfO_2$, $ZrO_2$, HfZrOx, HfSiOx, HfSiON, HfTiOx, ZrTiOx, ZrSiOx, ZrSiON, HfLaOx, ZrLaOx, LaAlOx, $La_2O_3$, HfAlOx, ZrAlOx, $Al_2O_3$, $Y_2O_3$, MgO, DyO, $TiO_2$, $Ta_2O_5$, or the like.

The gate structure 230 may be fabricated using a number of well-known process steps and techniques related to: material deposition; photolithography; etching; polishing; or the like. For example, the gate structure 230 could be created by conformally forming a layer of the insulating material 232 overlying the fin arrangement, and overlying the exposed portions of the layer of insulation material 204, followed by a conformal layer of the metal material 234 overlying the insulating material 232. Thereafter, the conductive material 236 can be formed overlying the metal material 234, and the various layers can be selectively etched into the desired layout of the gate structure 230. The resulting gate structure 230 transversely overlies the semiconductor fin structures 210. Moreover, the lowermost base sections of the gate structure 230 overlie the upper surface of the layer of insulation material 204 at locations between adjacent semiconductor fin structures 210.

As shown in FIG. 6, portions of the gate structure 230 overlie the oxygen diffusion barrier regions 220. Notably, these nitrided portions of the layer of insulation material 204 substantially inhibit the diffusion of oxygen from the insulation material 204 into the gate structure 230. More particularly, the oxygen diffusion barrier regions 220 substantially inhibit the diffusion of oxygen from the layer of insulation material 204 into the base sections of the gate structure 230.

Thereafter, any number of known process steps can be performed to complete the fabrication of one or more semiconductor devices that incorporate the semiconductor fin structures 210. For example, the manufacturing process can be carried out to complete the fabrication of at least one transistor device that includes the semiconductor fin structures 210 and the gate structure 230. These final process steps, and other back end process steps, will not be described here.

Figure 7:
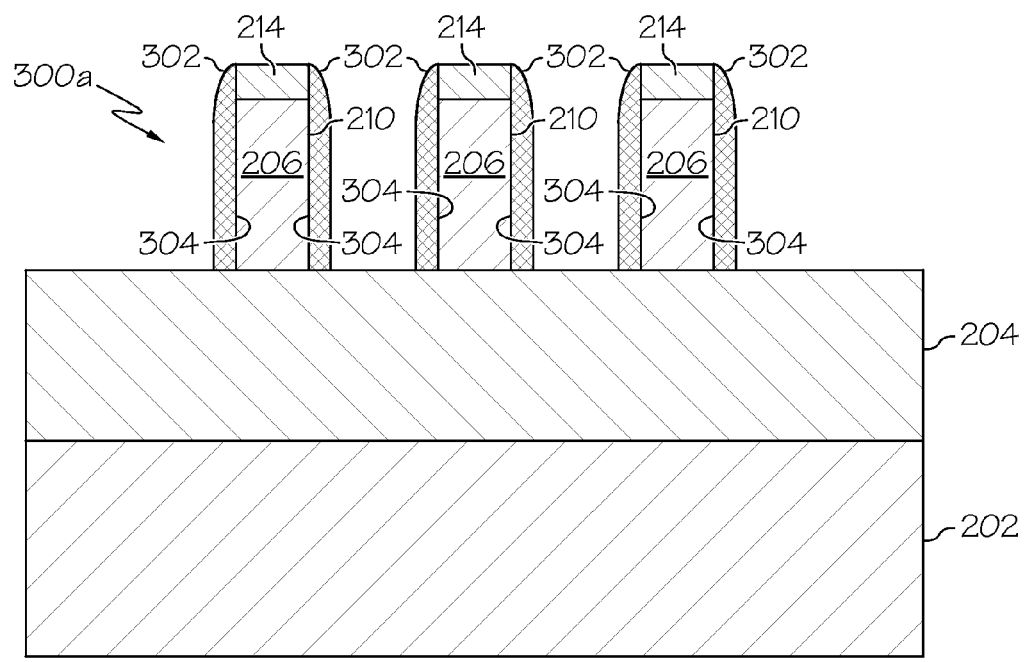
FIGS. 7-10 are cross-sectional views that illustrate another semiconductor device structure and an exemplary process for fabricating it.

The exemplary embodiment described above utilizes ion implantation to form the nitrided oxygen diffusion barrier regions 220. In practice, alternative methodologies could be utilized to create the nitrided oxygen diffusion barrier regions 220. In this regard, FIGS. 7-10 are cross-sectional views that illustrate another semiconductor device structure and an exemplary process for fabricating it. FIG. 7 depicts the state of the semiconductor device structure 300a after the semiconductor fin structures 210 have been fabricated (as described above with reference to FIG. 3 and FIG. 4). After creation of the semiconductor fin structures 210, this exemplary manufacturing process continues by forming protective spacers 302 adjacent to the sidewalls 304 of the semiconductor fin structures 210. The spacers 302 can be formed in a conventional manner using well known process techniques that will not be described in detail here. In this regard, the spacers 302 may be formed by depositing a layer of spacer-forming material (preferably, silicon nitride) over the exposed surfaces of the semiconductor device structure 300a, followed by anisotropic etching of the deposited spacer-forming material using an etchant that selectively removes the spacer-forming material while leaving at least some of the hard mask material 214 and the insulation material 204 substantially intact. The spacers 302 are formed to protect the sidewalls 304 of the semiconductor fin structures 210 during the subsequent nitridation of the layer of insulation material 204.

Figure 8:
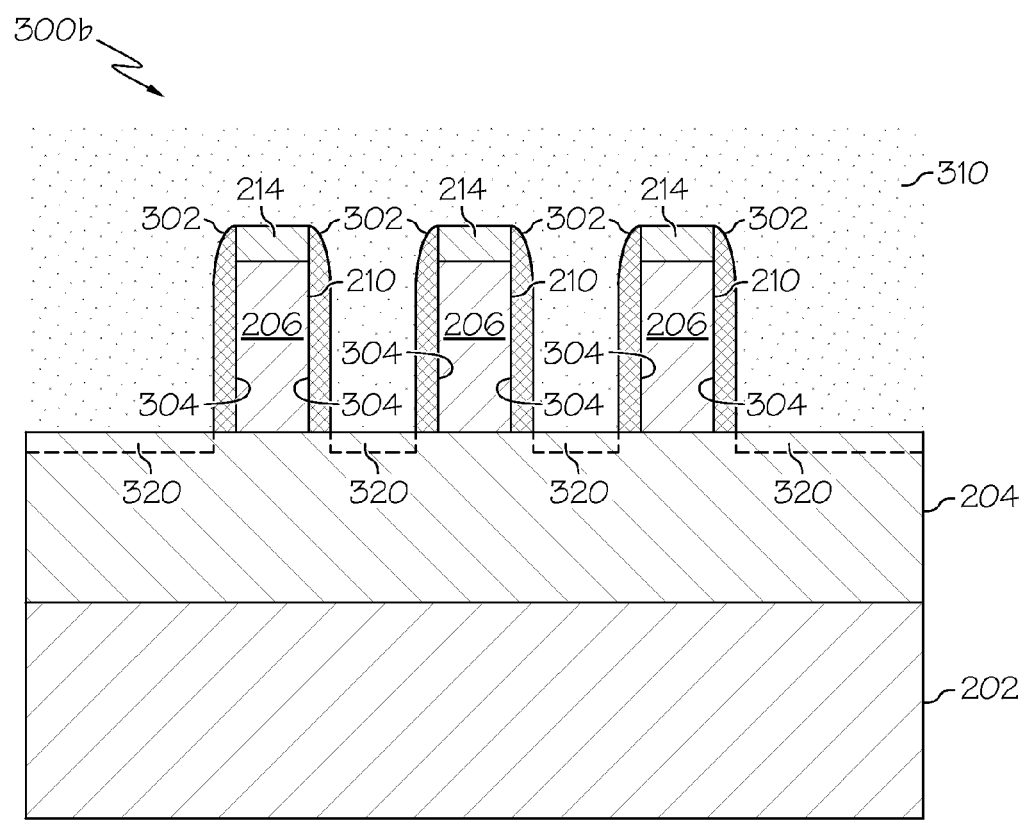

Although other fabrication steps and sub-processes may be performed at this time, the exemplary embodiment continues by performing either a thermal nitridation process or a plasma nitridation process to incorporate nitrogen into the layer of insulation material 204. In this regard, FIG. 8 depicts the semiconductor device structure 300b undergoing a nitridation process (plasma or thermal) during which the layer of insulation material 204 is exposed to a nitrogen-containing gas 310 (the speckled area in FIG. 8 represents the nitrogen-containing gas 310). Depending upon the particular embodiment and/or nitridation procedure, the nitrogen-containing gas 310 may include, without limitation, $NH_3$, $N_2H_2$, $NH_4OH$, $N_2O$, or the like. During this nitridation procedure, the hard mask material 214 and the spacers 302 protect the semiconductor material 206 and prevent or inhibit nitridation of the semiconductor material 206. The nitridation process, however, results in the incorporation of nitrogen into the layer of insulation material 204 and, consequently, the formation of oxygen diffusion barrier regions 320. In other words, the oxygen diffusion barrier regions 320 are realized as plasma-nitrided or thermally-nitrided regions of the insulation material 204.

Figure 9:
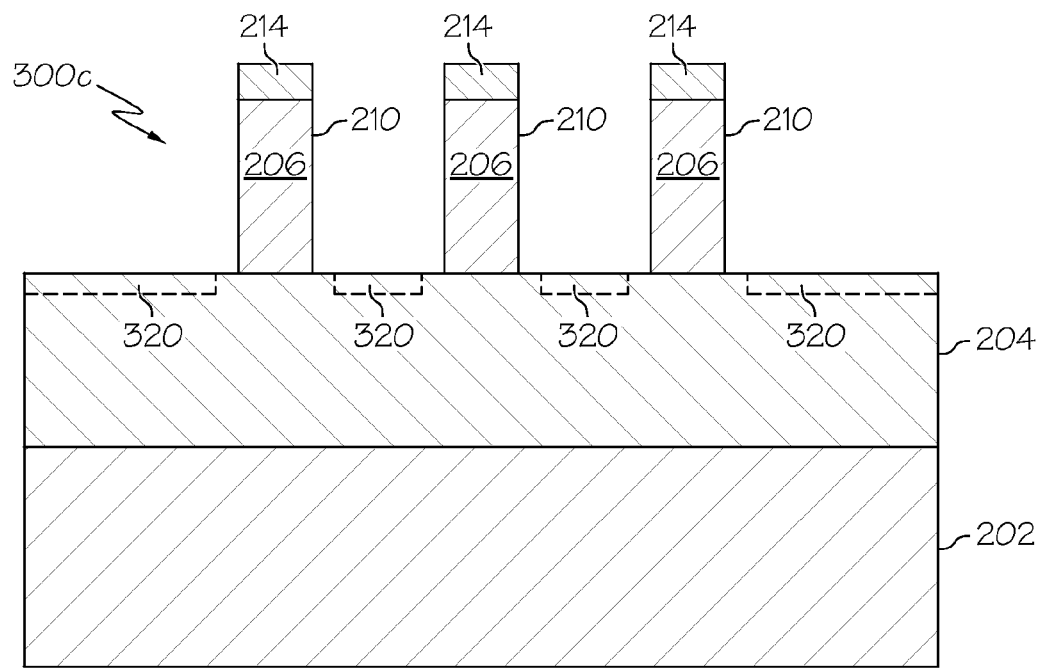

Although other fabrication steps and sub-processes may be performed at this time, the exemplary embodiment continues by removing the spacers 302 from the semiconductor fin structures 210 without removing all of the nitrogen-containing barrier to oxygen diffusion. FIG. 9 depicts the state of the semiconductor device structure 300c after the spacers 302 have been removed. The spacers 302 can be removed in a conventional manner, e.g., by selective etching of the material used to create the spacers 302. Although not depicted in FIG. 9, this etching step may also result in the partial or complete removal of the hard mask material 214 that resides on the semiconductor fin structures 210.

Figure 10:
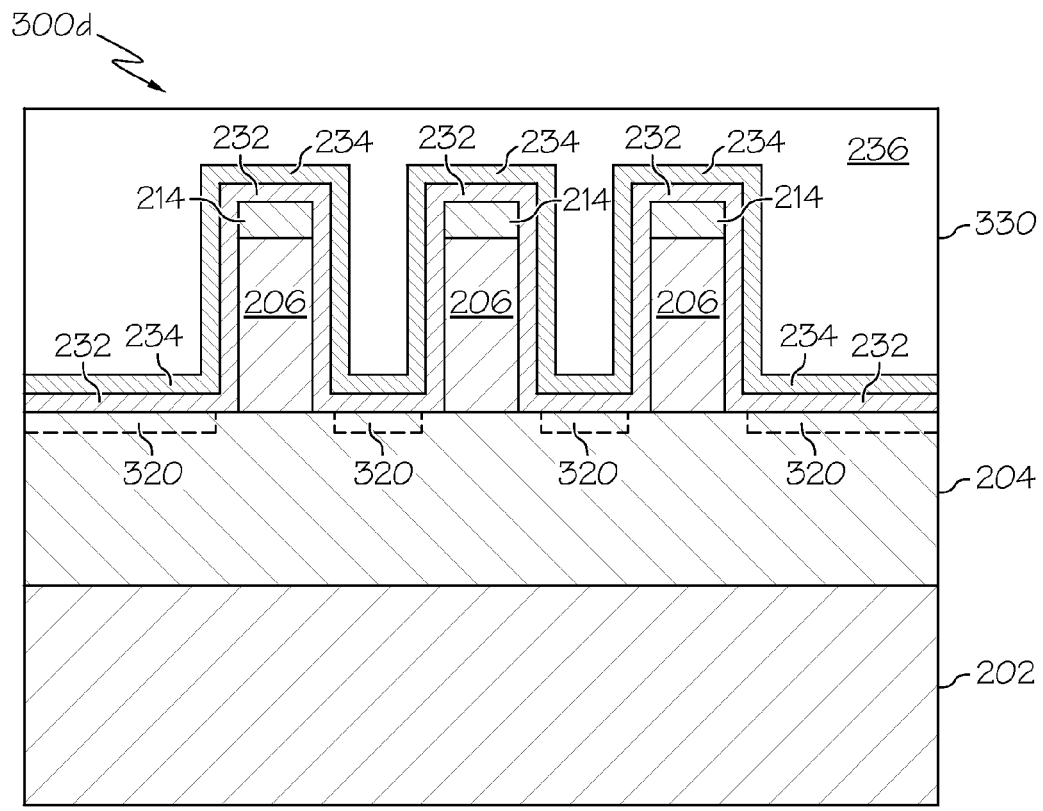

Although other fabrication steps and sub-processes may be performed at this time, the exemplary embodiment continues by forming a gate structure overlying the fin arrangement. FIG. 10 depicts the state of the semiconductor device structure 300d after the fabrication of a gate structure 330, which is similar to the gate structure 230 described above with reference to FIG. 6. For this reason, the elements and features of the gate structure 330 will not be redundantly described in detail here. It should be appreciated that the gate structure 330 transversely overlies the semiconductor fin structures 210, and overlies some of the oxygen diffusion barrier regions 320. Accordingly, the oxygen diffusion barrier regions 320 substantially inhibit the diffusion of oxygen from the layer of insulation material 204 into the base sections of the gate structure 330 (more specifically, from the layer of insulation material into the high-k insulating material 232).

HKMG device fabrication processes may employ either a "gate-first" approach or a "gate-last" approach. The gate-last approach is also commonly referred to as the "replacement gate" approach. In one gate-last approach, the high-k dielectric is deposited early in the process, followed by a dummy gate that is later removed and replaced by the final (replacement) gate material. In another gate-last approach, the dummy gate is created without first depositing the permanent high-k dielectric. In this approach, the high-k dielectric material and the replacement gate material are deposited after the dummy gate is removed. Even with a replacement gate approach, the nitridation techniques described above are feasible and effective—more notably so with the "high-k early" version than perhaps with the "high-k late" deposition version.

Thereafter, any number of known process steps can be performed to complete the fabrication of one or more semiconductor devices that incorporate the semiconductor fin structures 210. For example, the manufacturing process can be carried out to complete the fabrication of at least one transistor device that includes the semiconductor fin structures 210 and the gate structure 330. These final process steps, and other back end process steps, will not be described here.

The manufacturing processes described above begin with traditional SOI substrates having a support layer, a buried oxide layer overlying the support layer, and semiconductor material overlying the buried oxide layer, where the semiconductor fin structures are formed from the semiconductor material. After formation of the semiconductor fin structures, the buried oxide layer is nitrided (using ion implantation, plasma nitridation, or thermal nitridation) to create the oxygen diffusion barrier regions. Other exemplary embodiments could instead begin with an SOI substrate that includes a pre-treated (nitrided) insulator layer rather than a traditional buried oxide layer. In such embodiments, the pre-treated SOI substrate could be fabricated at any time before starting the actual fabrication process.

In certain embodiments, a pre-treated SOI substrate is manufactured by forming an oxide subsurface layer within a layer of silicon material. This oxide layer can be formed by oxygen implantation, as is understood. In other embodiments, an SOI substrate can be created by first depositing a layer (typically $SiO_2$, SiN, or SiON) onto a "handle wafer." In accordance with certain embodiments, the oxide insulation layer is nitrided (by ion implantation, thermal nitridation, plasma nitridation, or the like) to form an oxygen diffusion barrier region that resides at or near the upper surface of the silicon oxide insulation layer. This results in a nitrided upper region of the oxide insulation material. Thereafter, the handle wafer is transfer-bonded to the final silicon substrate wafer, thus forming a pre-treated SOI substrate having an oxygen diffusion barrier implemented therein. This pre-treated SOI substrate can then be used to fabricate a fin arrangement using conventional techniques and technologies. The substrate need not be subjected to a subsequent nitridation procedure because its insulation layer already includes the desired oxygen diffusion barrier region.

In yet other embodiments, an SOI substrate is manufactured by forming a nitrogen-containing and/or a nitrided insulation layer (in lieu of the conventional oxide insulation layer). For example, silicon oxynitride or silicon nitride could be deposited or otherwise formed on the handle wafer. For this embodiment, the insulation layer of the SOI substrate has inherent oxygen diffusion barrier properties, which eliminates the need to perform additional treatment or nitridation of the insulation layer. As mentioned above, this SOI substrate can then be used to fabricate a fin arrangement using conventional techniques and technologies.

Figure 11:
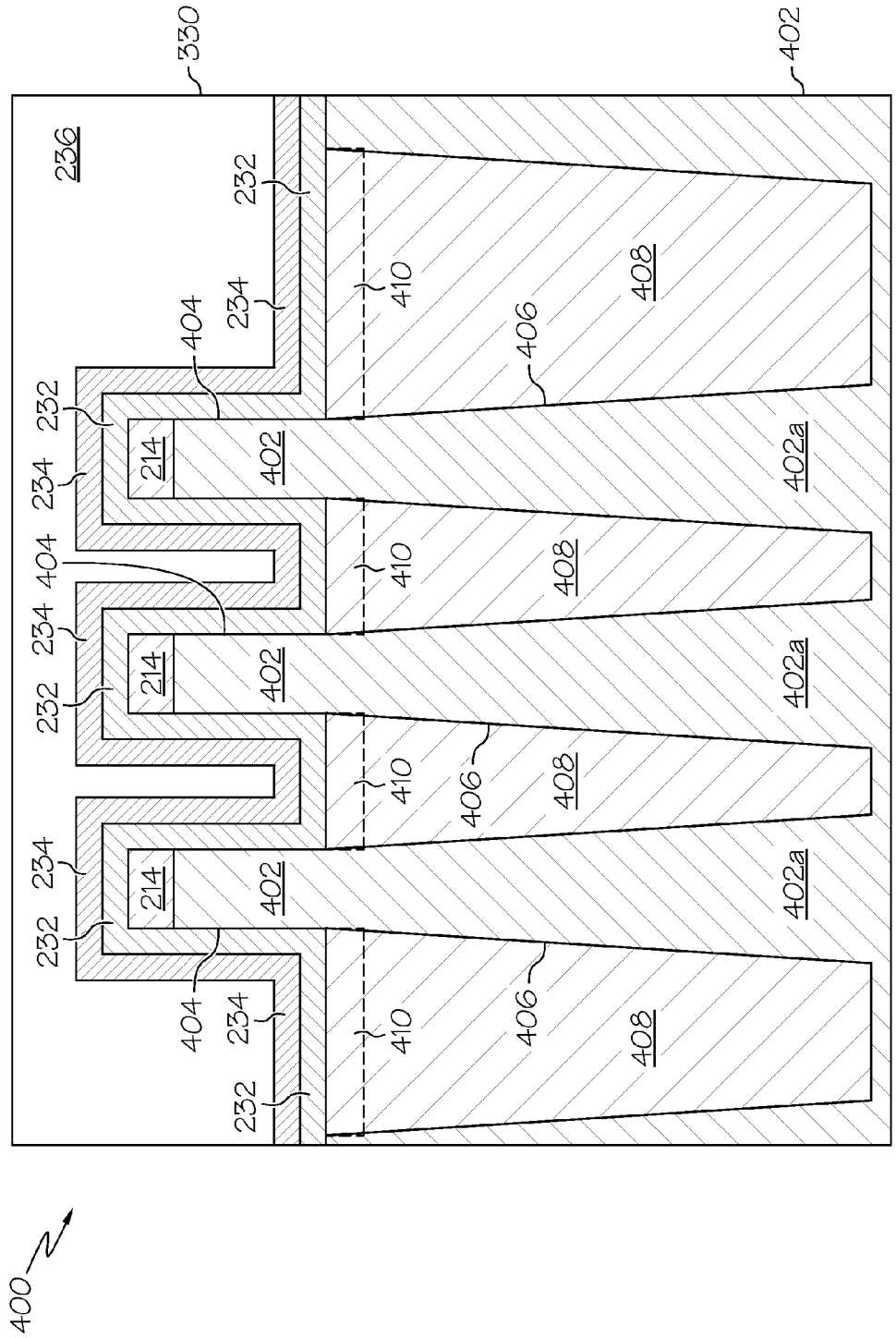
FIG. 11 is a cross-sectional view that illustrates a semiconductor device structure implemented using a bulk semiconductor substrate.

Although the exemplary embodiments described above utilize SOI substrates, various embodiments may instead employ bulk semiconductor substrates. In this regard, FIG. 11 is a cross-sectional view that illustrates a semiconductor device structure 400 implemented using a bulk semiconductor substrate formed of a semiconductor material 402 such as silicon. The semiconductor device structure 400 includes fin structures 404 formed from the semiconductor material 402. As described above for the semiconductor device structure 300d (see FIG. 10), this embodiment includes hard mask material 214 at the ends of the semiconductor fin structures 404, and a gate structure 330 that transversely overlies the semiconductor fin structures 404 and the hard mask material 214. Again, the gate structure 330 may include the layer of insulating material 232, the layer of metal material 234, and the optional layer of amorphous silicon, polycrystalline silicon, or other conductive material 236.

In contrast to the embodiment depicted in FIG. 10, the fin structures 404 "extend" downward such that each fin structure 404 has a base region 406 that is formed from the same semiconductor material (labeled 402a). These base regions 406 are separated by adjacent STI regions 408. As is well understood, the STI regions 408 are formed deep enough to provide the necessary amount of insulation for the fin structures 404. Notably, the semiconductor device structure 400 also includes oxygen diffusion barrier regions 410 formed in the STI regions 408; these oxygen diffusion barrier regions 410 substantially inhibit the diffusion of oxygen from the STI regions 408 into the high-k insulating material 323 (as described above).

In practice, the fabrication of the semiconductor fin structures 404 from a bulk semiconductor substrate involves etching of trenches between adjacent fins. Those trenches are then either only partially refilled or completely refilled and then etched partially back. In either manner, the fin structures 404 protrude above the final surface of the fill material, which is conventionally oxide or a layer of a liner material and a fill oxide material. Accordingly, the oxide insulation regions are created after formation of the fin structures 404 in this embodiment. These oxide insulation regions or layers (e.g., the STI regions 408 or LOCOS regions) can be treated in the manner described above for the layer of insulation material 204. In other words, oxide insulation regions, areas, or layers (that might otherwise be in contact with, or in close proximity to, the high-k gate insulator material) can be nitrided using ion implantation, thermal nitridation, or plasma nitridation to create oxygen diffusion barrier regions for a bulk semiconductor substrate implementation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   forming a fin arrangement overlying a substrate that contains regions of oxide material, the fin arrangement comprising one or more semiconductor fin structures;
   creating an oxygen diffusion barrier in the substrate;
   thereafter, conformally forming a layer of insulating material overlying the fin arrangement and overlying and in direct contact with the oxygen diffusion barrier;
   conformally forming a layer of metal material overlying the layer of insulating material; and
   etching the layer of insulating material and the layer of metal material to form a gate structure transversely overlying the fin arrangement, and overlying the oxygen diffusion barrier, wherein the oxygen diffusion barrier substantially inhibits diffusion of oxygen from the oxide material into the gate structure.

2. The method of claim 1, wherein the oxygen diffusion barrier has an upper surface, and wherein conformally forming a layer of insulating material overlying the fin arrangement and overlying and in direct contact with the oxygen diffusion barrier comprises completely covering the upper surface of the oxygen diffusion barrier with the layer of insulating material.

3. The method of claim 1, wherein the fin arrangement comprises adjacent semiconductor fin structures, and wherein conformally forming a layer of metal material overlying the layer of insulating material comprises forming a portion of the layer of metal material between the adjacent semiconductor fin structures.

4. The method of claim 1, further comprising:
forming a cap on each semiconductor fin structure;
forming spacers adjacent sidewalls of each semiconductor fin structure and each cap thereon to define exposed portions of the oxide material; and
nitriding the exposed portions of the oxide material without nitriding the one or more semiconductor fin structures, resulting in nitrided portions of the oxide material.

5. The method of claim 1, wherein the fin arrangement comprises adjacent semiconductor fin structures, wherein conformally forming a layer of metal material overlying the layer of insulating material comprises forming a portion of the layer of metal material between the adjacent semiconductor fin structures, wherein the method further comprises forming a layer of conductive material overlying the layer of metal material, and wherein etching comprises etching the layer of conductive material to form the gate structure transversely overlying the fin arrangement.

6. The method of claim 1, wherein conformally forming a layer of metal material overlying the layer of insulating material comprises forming a portion of the layer of metal material between portions of the layer of insulating material.

7. The method of claim 1, wherein conformally forming a layer of metal material comprises conformally forming a layer of metal material directly in contact with the layer of insulating material.

8. The method of claim 5, wherein conformally forming a layer of conductive material overlying the layer of metal material comprises forming a portion of the layer of conductive material between the adjacent semiconductor fin structures.

9. A method of fabricating a semiconductor device, the method comprising:
providing a semiconductor-on-insulator substrate having an oxide insulator layer and a layer of semiconductor material overlying the oxide insulator layer;
forming fin structures from the layer of semiconductor material, each of the fin structures extending above an exposed upper surface of the oxide insulator layer;
thereafter, treating exposed portions of the oxide insulator layer to create oxygen diffusion barrier regions near the exposed upper surface of the oxide insulator layer;
thereafter, forming a layer of insulating material overlying the fin structures and overlying and in direct contact with the oxygen diffusion barrier regions;
forming a layer of metal material overlying the layer of insulating material; and
etching the layer of insulating material and the layer of metal material to form a gate structure transversely overlying the fin structures, and overlying the oxygen diffusion barrier regions, wherein the oxygen diffusion barrier regions substantially inhibit diffusion of oxygen from the oxide insulator layer into the gate structure.

10. The method of claim 9, wherein each oxygen diffusion barrier region has an upper surface, and wherein forming a layer of insulating material overlying the fin structures and overlying and in direct contact with the oxygen diffusion barrier regions comprises completely covering the upper surfaces of the oxygen diffusion barrier regions with the layer of insulating material.

11. The method of claim 9, wherein fin structures include adjacent fin structures, and wherein forming a layer of metal material overlying the layer of insulating material comprises forming a portion of the layer of metal material between the adjacent fin structures.

12. The method of claim 9, further comprising:
forming a cap on each fin structure;
forming nitride spacers adjacent sidewalls of each fin structure and each cap thereon, wherein forming the nitride spacers occurs before treating the exposed portions of the oxide insulator layer.

13. The method of claim 9, wherein the fin structures include adjacent fin structures, wherein forming a layer of metal material overlying the layer of insulating material comprises forming a portion of the layer of metal material between the adjacent fin structures, wherein the method further comprises forming a layer of conductive material overlying the layer of metal material, and wherein etching comprises etching the layer of conductive material to form the gate structure transversely overlying the fin structures.

14. The method of claim 9, wherein forming a layer of metal material overlying the layer of insulating material comprises forming a portion of the layer of metal material between portions of the layer of insulating material.

15. The method of claim 13, wherein forming a layer of conductive material overlying the layer of metal material comprises forming a portion of the layer of conductive material between the adjacent fin structures.

16. A semiconductor device structure comprising:
a layer of oxide insulation material having an upper surface;
semiconductor fin structures formed overlying the layer of oxide insulation material;
a gate structure transversely formed overlying the semiconductor fin structures such that base sections of the gate structure overlie the upper surface between adjacent semiconductor fin structures, and wherein the base sections of the gate structure include a layer of insulating material and a layer of metal material overlying the layer of insulating material; and
oxygen diffusion barrier regions of the oxide insulation material, located near the upper surface and adjacent and in direct contact with the layer of insulating material of the base sections of the gate structures, wherein the oxygen diffusion barrier regions substantially inhibit diffusion of oxygen from the layer of oxide insulation material into the base sections of the gate structure.

17. The semiconductor device structure of claim 16, wherein the base sections of the gate structure include a layer of conductive material overlying the layer of metal material.

18. The semiconductor device structure of claim 16, wherein the layer of insulating material is interposed between each semiconductor fin structure and the layer of metal material to prevent contact therebetween, and wherein the layer of insulating material is interposed between the oxygen diffusion barrier regions and the layer of metal material to prevent contact therebetween.

19. The semiconductor device structure of claim 16, wherein the oxygen diffusion barrier regions comprise implant regions having ions of a nitrogen-containing species implanted therein.

20. The semiconductor device structure of claim 16, wherein:
the layer of oxide insulation material is a layer of a semiconductor-on-insulator (SOI) substrate; and
the semiconductor fin structures are formed from a semiconductor layer of the SOI substrate.

21. The semiconductor device structure of claim 20, wherein:
the SOI substrate comprises a nitrided upper region of the oxide insulation material; and the oxygen diffusion barrier regions are formed from the nitrided upper region.

22. A semiconductor device structure comprising:
a substrate of semiconductor material;
semiconductor fin structures formed from the semiconductor material;
oxide isolation regions between the semiconductor fin structures;
a gate structure transversely formed overlying the semiconductor fin structures, wherein the gate structure includes a layer of insulating material and a layer of metal material overlying the layer of insulating material, and wherein portions of the layer of insulating material and portions of the layer of metal material are located between the semiconductor fin structures; and
oxygen diffusion barrier regions of the oxide isolation regions, wherein the oxygen diffusion barrier regions substantially inhibit diffusion of oxygen from the oxide isolation regions into the gate structure.

23. The semiconductor device structure of claim 22, wherein the oxygen diffusion barrier regions are in direct contact with the layer of insulating material of the gate structure.

24. A method of fabricating a semiconductor device, the method comprising:
providing a semiconductor-on-insulator substrate having an oxide insulator layer, a layer of semiconductor material overlying the oxide insulator layer, and an oxygen diffusion barrier between the oxide insulation layer and the layer of semiconductor material;
forming fin structures from the layer of semiconductor material;
thereafter, forming a layer of insulating material overlying the fin structures and overlying and in direct contact with the oxygen diffusion barrier;
forming a layer of metal material overlying the layer of insulating material; and
etching the layer of insulating material and the layer of metal material to form a gate structure transversely overlying the fin structures, and overlying the oxygen diffusion barrier, wherein the oxygen diffusion barrier substantially inhibits diffusion of oxygen from the oxide insulator layer into the gate structure.

25. The method of claim 24, wherein the fin structures comprise adjacent fin structures, and wherein forming a layer of metal material overlying the layer of insulating material comprises forming a portion of the layer of metal material between the adjacent fin structures.

26. The method of claim 24 wherein the oxygen diffusion barrier has an upper surface, and wherein forming a layer of insulating material overlying the fin structures and overlying and in direct contact with the oxygen diffusion barrier comprises completely covering the upper surfaces of the oxygen diffusion barrier with the layer of insulating material.

* * * * *